(12) United States Patent
Topping

(10) Patent No.: US 10,586,881 B2
(45) Date of Patent: Mar. 10, 2020

(54) GAP BETWEEN SEMICONDUCTORS

(71) Applicant: POWER ROLL LIMITED, Sunderland (GB)

(72) Inventor: Alexander John Topping, Sunderland (GB)

(73) Assignee: POWER ROLL LIMITED, Sunderland (GB)

(*) Notice: Subject to any disclaimer, the term of this patent is extended or adjusted under 35 U.S.C. 154(b) by 0 days.

(21) Appl. No.: 16/091,598

(22) PCT Filed: Apr. 6, 2017

(86) PCT No.: PCT/GB2017/050972
§ 371 (c)(1),
(2) Date: Oct. 5, 2018

(87) PCT Pub. No.: WO2017/174996
PCT Pub. Date: Oct. 12, 2017

(65) Prior Publication Data
US 2019/0088806 A1     Mar. 21, 2019

(30) Foreign Application Priority Data
Apr. 7, 2016    (GB) .................................. 1605917.2

(51) Int. Cl.
*H01L 31/0352*    (2006.01)
*H01L 31/0216*    (2014.01)
(Continued)

(52) U.S. Cl.
CPC ................ *H01L 31/035281* (2013.01); *H01L 31/022425* (2013.01); *H01L 31/072* (2013.01)

(58) Field of Classification Search
CPC ............ H01L 31/0216; H01L 31/0236; H01L 31/02366; H01L 31/02363; H01L 31/0352;
(Continued)

(56) References Cited

U.S. PATENT DOCUMENTS 3,948,682 A    4/1976  Bordina et al.
4,110,122 A    8/1978  Kaplow et al.
(Continued)

FOREIGN PATENT DOCUMENTS

DE    19943720    5/2000
DE    19937724    12/2000
(Continued)

OTHER PUBLICATIONS

International Search Report and Written Opinion dated Jun. 23, 2017 in International Application No. PCT/GB2017/050968 (10 pages).
(Continued)

*Primary Examiner* — Susan D Leong
(74) *Attorney, Agent, or Firm* — Meunier Carlin & Curfman LLC

(57) ABSTRACT

An optoelectronic device comprising a substrate comprising a groove having a first and a second side. The first and second sides of the groove are each coated with a conductor material and a semiconductor material. The semiconductor material on the first side of the groove and the conductor material on the second side of the groove are in contact with another semiconductor material in the groove. At the second side of the groove there is a gap between the semiconductor material on the second side of the groove and the another semiconductor material in the groove.

18 Claims, 9 Drawing Sheets

(51) Int. Cl.
*H01L 31/0236* (2006.01)
*H01L 31/047* (2014.01)
*H01L 31/0224* (2006.01)
*H01L 31/072* (2012.01)

(58) Field of Classification Search
CPC .................. H01L 31/047; H01L 31/05; H01L 31/035281
See application file for complete search history.

(56) References Cited

U.S. PATENT DOCUMENTS

| | | | |
|---|---|---|---|
| 4,283,589 A | 8/1981 | Kaplow et al. | |
| 4,295,002 A | 10/1981 | Chappell et al. | |
| 4,335,503 A | 6/1982 | Evans et al. | |
| 4,379,944 A | 4/1983 | Borden et al. | |
| 5,067,985 A | 11/1991 | Carver et al. | |
| 5,147,468 A * | 9/1992 | Deguchi | H01L 31/075 136/244 |
| 5,689,358 A | 11/1997 | Nakao et al. | |
| 6,084,175 A | 7/2000 | Perry et al. | |
| 6,090,661 A | 7/2000 | Perng et al. | |
| 6,762,359 B2 | 7/2004 | Asai et al. | |
| 2004/0238833 A1 | 12/2004 | Nakata | |
| 2005/0022860 A1 | 2/2005 | Toh et al. | |
| 2005/0115602 A1 | 6/2005 | Senta et al. | |
| 2007/0034250 A1 | 2/2007 | Dutta | |
| 2008/0202581 A1 | 8/2008 | Kempa et al. | |
| 2009/0014056 A1 | 1/2009 | Hockaday | |
| 2010/0089443 A1 | 4/2010 | Bloomstein et al. | |
| 2010/0244056 A1 | 9/2010 | Ray et al. | |
| 2010/0275964 A1 | 11/2010 | Kinoshita | |
| 2010/0294536 A1 | 11/2010 | Usami | |
| 2010/0294539 A1 | 11/2010 | Sasaki et al. | |
| 2011/0036391 A1 | 2/2011 | McMormick et al. | |
| 2011/0290323 A1 | 12/2011 | Lee et al. | |
| 2012/0080087 A1 | 4/2012 | Denby | |
| 2012/0298175 A1 | 11/2012 | Van Roosmalen et al. | |
| 2013/0160818 A1 | 6/2013 | Li et al. | |
| 2013/0298980 A1 | 11/2013 | Fogel et al. | |
| 2014/0238461 A1 | 8/2014 | Luo et al. | |
| 2015/0132949 A1 * | 5/2015 | Lin | H01L 21/481 438/667 |
| 2015/0372176 A1 | 12/2015 | Topping | |

FOREIGN PATENT DOCUMENTS

| | | |
|---|---|---|
| EP | 1427026 | 6/2004 |
| EP | 2256820 | 12/2010 |
| GB | 2210462 | 6/1989 |
| JP | S6135573 | 2/1986 |
| JP | 2010529599 | 8/2010 |
| JP | 2012049542 | 3/2012 |
| WO | 2002059981 | 8/2002 |
| WO | 2007124725 | 11/2007 |
| WO | 2011034908 | 3/2011 |
| WO | 2012175902 | 12/2012 |
| WO | 2014118545 | 8/2014 |
| WO | 2015145166 | 10/2015 |
| WO | 2017174993 | 10/2017 |
| WO | 2017174997 | 10/2017 |

OTHER PUBLICATIONS

International Search Report and Written Opinion dated Jun. 23, 2017 in International Application No. PCT/GB2017/050972 (10 pages).
International Search Report and Written Opinion dated Jun. 23, 2017 in International Application No. PCT/GB2017/050974 (11 pages).
Hezel R. "Novel back contact silicon solar cells designed for very high efficiencies and low-cost mass production," Conference Record of the 29th IEEE Photovoltaic Specialists Conference 2002, vol. 29, May 19, 2002-May 24, 2002, pp. 114-117.
Sturm et al. "Chemical Vapor Deposition Epitaxy of Silicon-based Materials using Neopentasilane," ECS Transactions, 2008, 16(10), 799-805.
Wronski "Schottky-barrier characteristics of metal-amorphous-silicon diodes," Applied Physics Letters, 1975, 29(9), 1.
Kilmova et al. "High-Voltage Photovoltaic Cells with Alloyed Aluminum Contacts." Applied Solar Energy, 1992, 28(3), 20-24.

* cited by examiner

GAP BETWEEN SEMICONDUCTORS

The present invention relates to an optoelectronic device and more specifically a solar photovoltaic cell.

The term photovoltaic refers to the production of electricity, normally direct electrical current, from light at the junction between two materials that are exposed to the light. The light is normally sunlight and therefore photovoltaic is often referred to as solar photovoltaic. It is known to use semiconductors for the two materials. The semiconductor materials used exhibit a photovoltaic effect.

The two semiconductors are usually a p-type and an n-type semiconductor material. When joined together the boundary or interface between the two types of semiconductor material is referred to as a p-n junction. This type of p-n junction is usually created by doping one material with the other material. The doping may be by diffusion, ion implantation or epitaxy.

A p-n junction can be found in most optoelectronic devices that use semiconductors. These optoelectronic devices include photovoltaic or solar photovoltaic cells, diodes, light-emitting diodes (LEDs) and transistors. The p-n junction can be thought of as the active site where the generation or consumption of electrical energy occurs.

The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity and are relatively fragile, that is they are relatively easily damaged.

The present invention aims to mitigate one or more of the disadvantages of existing solar photovoltaic cells.

In accordance with a first aspect of the present invention there is provided an optoelectronic device comprising:
- a substrate comprising a groove having a first and a second side;
- the first and second sides of the groove each coated with a conductor material and a semiconductor material;
- the semiconductor material on the first side of the groove and the conductor material on the second side of the groove in contact with another semiconductor material in the groove; and
- wherein at the second side of the groove there is a gap between the semiconductor material on the second side of the groove and the another semiconductor material in the groove.

It may be an advantage of the present invention that, in use, the gap between the semiconductor material on the second side of the groove and the another semiconductor material in the groove one or more of stops, mitigates and substantially reduces the occurrence of shunting across the groove and therefore typically between the first and second sides of the groove.

The gap is typically an air gap. The gap may be filled with another material, preferably a non-conducting and/or electrically insulative material. The gap, and an air gap, is typically a form of electrical insulation between the semiconductor material on the second side of the groove and the another semiconductor material in the groove.

The gap between the semiconductor material and the another semiconductor material at the second side of the groove, typically means that the another semiconductor material is not in contact with and/or is insulated from, the semiconductor material.

The gap between the semiconductor material on the second side of the groove and the another semiconductor material in the groove may be at least 1 nm in length, normally at least 20 nm in length and typically at least 100 nm in length.

It may be an advantage of the present invention that the gap makes the optoelectronic device less susceptible, typically resistant to shorting and/or shunting across the groove. The gap in between the semiconductor and the another semiconductor material is designed to mitigate a charge transfer path/route from the semiconductor material on one side of the groove, through the another semiconductor and into the semiconductor material on the opposite side of the groove. This typically makes the optoelectronic device less susceptible to shunting.

The inventors of the present invention have, in this context, appreciated that the optoelectronic device should ideally provide an electrical pathway between a conductor material and semiconductor material through another semiconductor material. The inventors of the present invention have, in this context, also appreciated that an electrical pathway or junction between two portions of the same semiconductor material through another semiconductor material is undesirable.

Shunting is a parasitic parallel resistance across the optoelectronic device. Maximising shunt resistance makes the optoelectronic device more efficient. A higher shunting resistance reduces the occurrence of shunting. The gap between the semiconductor and the another semiconductor material typically minimises the structural shunting effects and this reduces the deleterious effect of shunting on the optoelectronic device.

Shunting also typically includes counter-electromotive forces EMF or CEMF. These back electromotive forces are the electromotive forces or voltage that push against the desired current which is generated on the face coated with the semiconductor.

The counter-electromotive forces are typically produced by the electrical pathway between two portions of the same semiconductor material through the another semiconductor material.

This electrical pathway or connection will typically produce two diodes in opposite directions. One diode will typically have a greater, normally much greater, area and this diode will normally dominate the function of the device. This may be due in part to its relative size and in part to the possible path through the conductor material.

The first side of the groove typically comprises a first face of the groove and a first surface of the substrate adjacent the groove. The second side of the groove typically comprises a second face of the groove and a second surface of the substrate adjacent the groove. The first and second surfaces adjacent the groove are typically at least substantially parallel with and/or in the same plane as the substrate. The first and second side of the groove are typically on the same surface of the substrate.

The first face of the groove is normally at a first angle relative to a normal from the substrate and the second face of the groove is normally at a second angle relative to the normal from the substrate. The first angle is normally from 45 to less than or equal to 90°. The second angle is normally from 45 to less than or equal to 90°.

The first and the second face of the groove typically define a cavity of the groove therebetween.

The first and second faces of the groove may each have a first and a second end. The first ends are typically in contact at the centre of the groove and/or bottom of the cavity, the second ends detached at a top of the cavity. In an alternative embodiment the first and second faces separately contact a base of the groove. The base of the groove may be a bottom of the groove.

The first and second sides of the groove are typically substantially equal portions and/or halves of the groove, separated by a line perpendicular to the plane of the substrate.

The semiconductor material may be a layer of semiconductor material. The conductor material may be a layer of conductor material. The layer of semiconductor material is typically on top of the layer of conductor material. The layer of conductor material is typically underneath the layer of semiconductor material. The conductor material is normally in contact with one or more of the first face, first surface, second face and second surface of the groove and the semiconductor material.

The conductor material is normally one or more of on, in contact with and coated on the second face of the groove and second surface of the substrate adjacent the groove. The conductor material may further be one or more of on, in contact with and coated on the first surface of the substrate adjacent the groove.

The semiconductor material is normally one or more of on, in contact with and coated on the first face of the groove and first surface of the substrate adjacent the groove. The semiconductor material may further be one or more of on, in contact with and coated on the second surface of the substrate adjacent the groove.

The first and/or second sides of the groove may each be coated with an adhesive material. The adhesive material may be a layer of adhesive material. The layer of adhesive material is typically in contact with one or more of the first face, first surface, second face and second surface of the groove, the conductor material and the semiconductor material.

The another semiconductor typically at least partially fills the groove and/or fills the groove between the first and second faces of the groove.

The another semiconductor in the groove may be referred to as having a surface between the first and second faces of the groove. The surface of the another semiconductor is typically not parallel and normally not substantially parallel to the plane of the substrate. The surface of the another semiconductor is typically at an angle and/or tilted with respect to the plane of the substrate.

The surface of the another semiconductor may be inclined or declined relative to a normal from the substrate. The surface of the another semiconductor may be non-normal to a normal from the substrate. When the surface of the another semiconductor is one or more of inclined or declined and non-normal relative to a normal from the substrate, the surface of the another semiconductor may be referred to as tilted relative to the groove.

The depth of the another semiconductor material in the groove at the second face may be less than the depth of the another semiconductor material at the first face. The depth of the another semiconductor will typically depend on the shape of the groove. When the depth of the another semiconductor material at the second side of the groove is less than the depth of the another semiconductor material at the first side of the groove, a surface the another semiconductor may be referred as tilted relative to the groove.

The another semiconductor material typically contacts only the first face of the groove and/or the conductor material on the first side of the groove and the another semiconductor contacts only the second face of the groove and/or the semiconductor material on the second side of the groove.

The groove may be any shape. The groove may be v-shaped, rounded or square. The cavity may have a flat bottom.

The semiconductor material may coat and/or cover from 20 to 80%, normally from 40 to 60% and optionally about 50% of the first face of the groove. The semiconductor material may coat and/or cover about 75% of the first face of the groove. The conductor material may coat and/or cover from 20 to 80%, normally from 40 to 60% and optionally about 50% of the second face of the groove. The conductor material may coat and/or cover about 75% of the second face of the groove.

It may be an advantage of the present invention that when the conductor material and/or semiconductor material coat and/or cover about 50%, preferably about 75%, of the second face and/or first face of the groove respectively, one or more of the efficiency, electrical current generated, power output and photoelectric conversion efficiency of the optoelectronic device is increased.

The coat of the conductor material and/or semiconductor material may be from 50 nm to 1000 nm thick, normally from 100 nm to 500 nm thick and typically from 100 to 200 nm thick. The coat of the conductor material and/or semiconductor material may therefore be referred to as a relatively thin coating.

It may be an advantage of the present invention that when the another semiconductor thickness is about 200 nm, one or more of the efficiency, electrical current generated, power output and photoelectric conversion efficiency of the optoelectronic device is increased. When the another semiconductor thickness is about 200 nm, the width of the groove may be about 1 µm, although this may vary for different groove shapes.

There is typically an aperture in the another semiconductor material.

It may be an advantage of the present invention that the aperture makes the optoelectronic device less susceptible to shorting and/or shunting across the groove. The aperture in the another semiconductor material typically increases the length of a charge transfer path/route across the top of the groove and this makes the optoelectronic device less susceptible to shunting.

The another semiconductor material typically has a first surface substantially parallel to the first face of the groove and a second surface substantially parallel to the second face of the groove, the first and second surfaces defining the aperture in the another semiconductor material.

The aperture may be referred to as a gap and/or crack. The shape of the aperture is typically substantially conformal with the shape of the groove. The shape of the aperture may match the shape of the groove.

The first and second surfaces of the another semiconductor may be referred to as sides of the aperture. The sides of the aperture may be substantially parallel to the first and second faces of the groove respectively. The sides of the aperture may be steeper or shallower than the first and/or second faces of the groove but are still be considered substantially parallel.

The first and the second face of the groove typically define a cavity of the groove therebetween. The aperture normally extends down into the cavity. The aperture typically extends down into the cavity between the first and second face of the groove.

The another semiconductor material may occupy from 10 to 95%, optionally from 15 to 75%, normally from 25 to 50% and typically 75% of the volume of the cavity of the groove. When for example the another semiconductor material occupies 75% of the volume of the cavity, a remaining 15% corresponds to the aperture in the another semiconductor material. The conductor material and semiconductor material account for the remaining volume. The volume of the cavity occupied by the another semiconductor material may be related to the shape of the groove.

The aperture in the another semiconductor material may extend up to 90%, optionally up to 60% and typically from 40 to 60% of the distance into the cavity of the groove. It may be an advantage of the present invention that a crack in the semiconductor material that extends about 50% of the distance into the cavity from the top of the cavity may increase the electrical current generated by the optoelectronic device. The distance the crack in the semiconductor material extends into the cavity from the top of the cavity may be related to the shape of the groove.

The semiconductor material on the first surface of the substrate adjacent the groove and therefore on the first side of the groove may be coated with an insulator material. The insulator material is typically on top of the semiconductor material.

It may be an advantage of the present invention that the insulator material makes the optoelectronic device less susceptible to shorting and/or shunting across the groove. The insulator material normally insulates, typically electrically insulates, the semiconductor material on the first surface of the substrate adjacent the groove from the another semiconductor in the groove. The insulator material may increase the length of and/or mitigate a charge transfer path/route across the top of the groove and this typically makes the optoelectronic device less susceptible to shunting.

The insulator material is typically an electrical insulator material. The insulator material may comprise a low surface energy material such as polytetrafluoroethylene (PTFE).

During manufacture of the optoelectronic device, the insulator material may repel the another semiconductor material when the another semiconductor material is being deposited in the groove. This may increase the distance and/or size of the gap between the semiconductor material on the second side of the groove and the another semiconductor material in the groove.

It may be an advantage of the present invention that an increase in the distance and/or size of the gap between the semiconductor material on the second side of the groove and the another semiconductor material in the groove makes the optoelectronic device less susceptible to shunting.

The semiconductor material is typically an n-type semiconductor material. The another semiconductor material is typically a p-type semiconductor material. In an alternative embodiment the semiconductor material is a p-type semiconductor material and the another semiconductor material is an n-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide, lead sulphide, selenium, boron phosphide, boron arsenide, gallium, indium nitride, indium phosphide, cadmium selenide, cadmium sulphide, cadmium telluride, zinc sulphide, zinc selenide, zinc telluride, copper chloride, copper sulphide, copper oxide, tin sulphide, tin telluride, zinc phosphide, titanium oxide, tin oxide, lithium niobate, lead iodide, gallium selenide, tin sulphide, iron oxide, nickel oxide, copper indium selenide, copper zinc tin sulphide, iron disulphide and copper zinc antimony sulphide.

The n-type semiconductor typically comprises one or more of silicon, germanium, phosphorus, selenium, tellurium, cadmium sulphide, zinc, indium, tin, oxides of the above and doped semiconducting oxides.

The p-type semiconductor typically comprises one or more of silicon, germanium, cadmium telluride, copper indium gallium selenide ('CIGS'), copper indium gallium diselenide, copper indium selenide (CIS), copper gallium selenide, copper oxide, boron, beryllium, zinc, cadmium, copper zinc tin sulphide (CZTS), perovskite, calcium titanium oxide, calcium titanate and lead sulphite.

The another semiconductor material may be an electron blocking material such as molybdenum trioxide. The electron blocking material may be a hole transporting, electron blocking material, such as vanadium pentoxide, tantalum pentoxide, spiro-polymers, and p-dot polymers. The semiconductor material may be a heterojunction, that is a mixture of one or more of a p-type semiconductor, n-type semiconductor and donor acceptor material.

The semiconductor and another semiconductor materials may meet at an interface and/or boundary. The interface is typically referred to as a p-n junction. The semiconductor and another semiconductor materials may together be referred to as an active material. The semiconductor and the another semiconductor are typically different materials.

The conductor material is typically ohmic and/or an ohmic contact to the another semiconductor material. The semiconductor material is typically rectifying and/or a rectifying contact to the another semiconductor material.

The active material in the groove and/or in the cavity of the groove and on the first and second faces of the groove may provide ohmic and rectifying contacts for insertion or extraction of charge from the active material. The active material may be one or more of photovoltaic, light emitting and ion conducting.

The conductor material may be an electrical conductor. The conductor material may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium and vanadium.

The substrate may comprise a first and a second series of grooves and a channel therebetween. The groove referred to above may be any one of the grooves of the first and/or second series of grooves. The channel typically transects the grooves of the first and second series of grooves.

It may be an advantage of the present invention that the channel separates the first and second series of grooves such that an electrical current can be taken from or supplied to the first series of grooves in isolation from the second series of grooves.

The first and second series of grooves are typically elongate grooves. The channel between the first and second series of grooves is typically an elongate channel.

The channel typically transects the grooves of the first and second series of grooves at or towards an end of each groove. The channel typically transects or crosses the grooves of the first series of grooves towards an end of each groove and then passes between the first and second series of grooves before transecting or crossing the grooves of the second series of grooves towards an opposite and/or opposing end of each groove.

Normally a portion, normally a substantial portion, of the first and second series of grooves and channel therebetween are substantially parallel, typically parallel to one another.

The channel may extend both perpendicular to and parallel to the first and second series of grooves. Normally the channel is perpendicular to the first and second series of grooves when it extends across the ends of the first and second series of grooves. Normally the channel is parallel to the first and second series of grooves when it extends between the first and second series of grooves. The angle at which the channel may extend across the ends of the first and second series of grooves can be variable and optionally be from 0 to 90°, normally from 35 to 55° and typically be 45°.

When the channel extends both perpendicular to and parallel to the first and second series of grooves, the channel may be referred to as running in at least two directions to connect said first and second series of grooves.

When the channel extends substantially perpendicular and across the ends of the first and second series of grooves, it may also extend in at least two directions relative to the first and second series of grooves. When the channel extends in at least two directions relative to the first and second series of grooves it typically forms a zigzag shape.

A surface of the substrate comprising the groove may be referred to as a structured surface. The structured surface is typically not flat. The substrate may have another surface that is flat.

The channel may be referred to as a delineation feature. The channel typically separates the first and second series of grooves. The channel typically has a first and a second side. The first side of the channel typically comprises a first face of the channel and a first surface of the substrate adjacent the channel. The second side of the channel typically comprises a second face of the channel and a second surface of the substrate adjacent the channel. The first and second surfaces adjacent the channel are typically at least substantially parallel with and/or in the same plane as the substrate. The first and second side of the channel are typically on the same surface of the substrate. The first and second sides of the channel are typically coated with the conductor material and the semiconductor material.

There is typically a channel cavity between the first and second faces of the channel.

The first face of the channel is typically at a first angle relative to a normal from the substrate and the second face of the channel is typically at a second angle relative to a normal from the substrate. The first face of the channel and the second face of the channel may be perpendicular to the plane of the substrate. The first angle is normally from 45 to less than or equal to 90°. The second angle is normally from 45 to less than or equal to 90°.

There is usually no electrical communication between the conductor material on the second side and/or face of the channel, semiconductor material on the first side and/or face of the channel and the another semiconductor material in the channel.

A first side and a second side of the channel may provide the positive and negative poles of an electrical circuit. The first side of the channel may be in electrical communication, typically attached to, the positive or negative pole of the electrical circuit. The second side of the channel may be in electrical communication, typically attached to, the other pole, that is the negative or positive pole respectively of the electrical circuit.

The channel is typically non-conductive. The channel typically separates and/or insulates the first and second sides of the channel from one another.

The optoelectronic device may be referred to as a two terminal device. The first and second series of grooves may be referred to as cascaded groove structures. In use the device may be fabricated in a series arrangement and operated in a parallel or a combined series and parallel arrangement.

The channel cavity between the first and second faces of the channel may be any shape and is normally U-shaped, V-shaped or semi-spherical. The channel cavity between the first and second faces of the channel may have a flat bottom. The shape of the cavity between the first and second faces of the first and second series of grooves may be the same or different to the shape of the channel cavity between the first and second faces of the channel.

The bottom of the channel cavity may be flat or may be rutted. The rutted bottom of the channel cavity may be referred to as uneven or rough. The rutted bottom of the channel cavity typically increases the surface area of the bottom of the channel cavity. Increasing the surface area of the bottom of the channel cavity may help to ensure the channel separates and/or insulates the first and second sides of the channel from one another.

The channel and grooves of the first and second series of grooves typically have a depth measured from an upper surface of the substrate to a point in the channel or groove furthest from the upper surface.

The depth of the channel is typically greater than the depth of the grooves of the first and second series of grooves. The depth of the channel may be at least twice the depth of the grooves of the first and second series of grooves.

The channel has a depth and a width. The depth of the channel is typically twice the width of the channel. The aspect ratio for the depth to the width of the channel is therefore typically about 2:1.

The first and second series of grooves typically form a series of ridges and cavities. The first and second series of grooves may comprise at least 2 cavities, typically from 2 to 500 cavities.

Each groove and/or the grooves of the first and second series of grooves is typically from 5 to 200 mm long, normally from 5 to 1000 mm long and preferably 330 mm long. Each groove and/or the grooves of the first and second series of grooves is typically from 0.3 to 100 μm wide, normally from 0.3 to 5 μm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The optoelectronic device is typically a solar photovoltaic cell.

The optoelectronic device may be one or more of attached, secured and applied to a vehicle, for example a car or lorry, a building, for example a roof, and any other surface of a structure. The structure may be man-made or natural.

A surface that the optoelectronic device is one or more of attached, secured and applied to may be flat or uneven, that is one or more of rough, bumpy, irregular and/or rutted.

Embodiments of the invention will now be described by way of example only and with reference to the accompanying drawings, in which.

Figure 1:
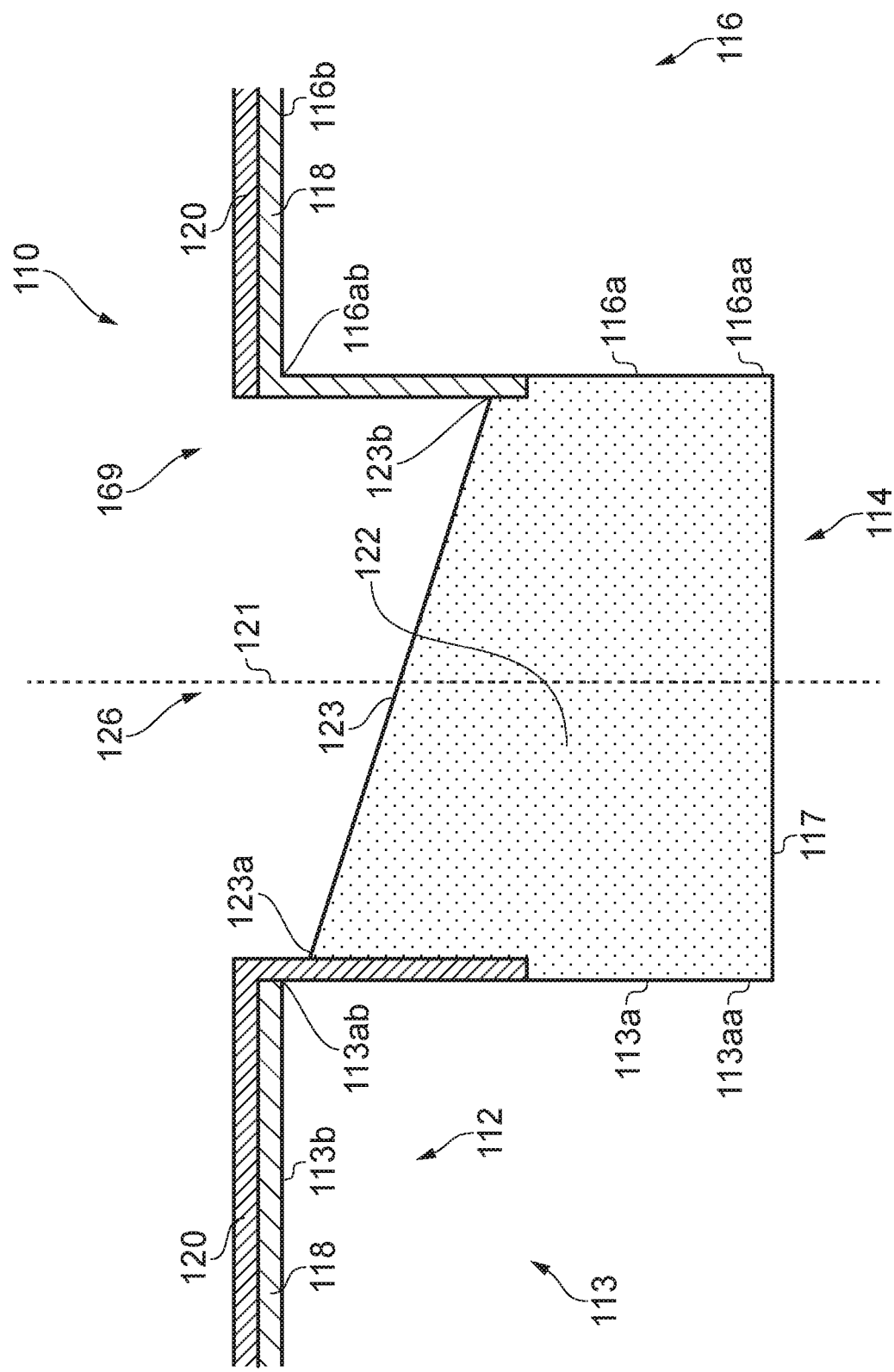
FIG. 1 is a cross-sectional view of a groove of an optoelectronic device according to a first embodiment of the present invention

FIG. 1 shows an optoelectronic device 110 comprising a substrate 112 comprising a groove 114 having a first 113 and a second 116 side. The first 113 and second 116 sides of the groove 114 each coated with a conductor material 118 and a semiconductor material 120. The semiconductor material 120 on the first side 113 of the groove 114 and the conductor material 118 on the second side 116 of the groove 114 in contact with another semiconductor material 122 in the groove 114. At the second side 116 of the groove there is a gap 169 between the semiconductor material 120 on the second side 116 of the groove 114 and the another semiconductor material 122 in the groove 114.

The first 113 and second 116 sides of the groove 114 are substantially equal halves of the groove 114, separated by a line 121 perpendicular to the plane of the substrate 112.

The first side 113 of the groove 114 comprises a first face 113a of the groove 114 and a first surface 113b of the substrate 112 adjacent the groove 114. The second side 116 of the groove 114 comprises a second face 116a of the groove 114 and a second surface 116b of the substrate 112 adjacent the groove 114. The first 113a and the second 116a face of the groove 114 define a cavity 126 of the groove 114 therebetween. The first 113b and second 116b surfaces adjacent the groove 114 are substantially parallel with the substrate 112.

The groove 114 is square shaped. The first face 113a of the groove 114 is at a 90° angle relative to the plane of the substrate 112. The second face 116a of the groove 114 is also at a 90° angle relative to the plane of the substrate 112. The first 113a and second 116a faces of the groove 114 each have a first 113aa, 116aa and a second 113ab, 116ab end. The first ends 113aa, 116aa separately contact a flat bottom, or base, 117 of the groove 114; and the second ends 113ab, 116ab are detached at a top of the cavity 126.

The semiconductor material 120 is a layer of semiconductor material, and the conductor material 118 is a layer of conductor material. The layer of semiconductor material 120 is on top of the layer of conductor material 118; and the layer of conductor material 118 is underneath the layer of semiconductor material 120. The conductor material 118 is in contact with the second face 116a of the groove 114 and second surface 116b of the substrate 112 adjacent the groove 114. The conductor material 118 is also in contact with the first surface 113b of the substrate 112 adjacent the groove 114. The semiconductor material 120 is in contact with the first face 113a of the groove 114 and the first surface 113b of the substrate 112 adjacent the groove 114. The semiconductor material 120 is also in contact with the second surface 116b of the substrate 112 adjacent the groove 114.

The another semiconductor 122 partially fills the groove 114 between the first 113a and second 116a faces of the groove 114. The another semiconductor 122 in the groove 114 has a surface 123 between the first 113a and second 116a faces of the groove 114. The another semiconductor material 122 occupies 75% of the volume of the cavity 126 of the groove 114.

The depth 123b of the another semiconductor material 122 in the groove 114 at the second face 116a is less than the depth 123a of the another semiconductor material 122 at the first face 113a. The surface 123 of the another semiconductor 122 is at an angle, or tilted, with respect to the plane of the substrate 112. The surface 123 of the another semiconductor 122 is tilted relative to the groove 114.

The another semiconductor material 122 contacts the first face 113a of the groove 114 and the semiconductor material 120 at the first side 113 of the groove 114. The another semiconductor material 122 also contacts the second face 116a of the groove 114 and the conductor material 118 at the second side 116 of the groove 114. The semiconductor material 120 coats about 50% of the first face 113a of the groove 114. The conductor material 118 coats about 50% of the second face 116a of the groove 114.

The gap 169 between the semiconductor material 120 and the another semiconductor material 122 at the second side 116 of the groove 114 means that the another semiconductor material 122 is not in contact with the semiconductor material 120.

Figure 2:
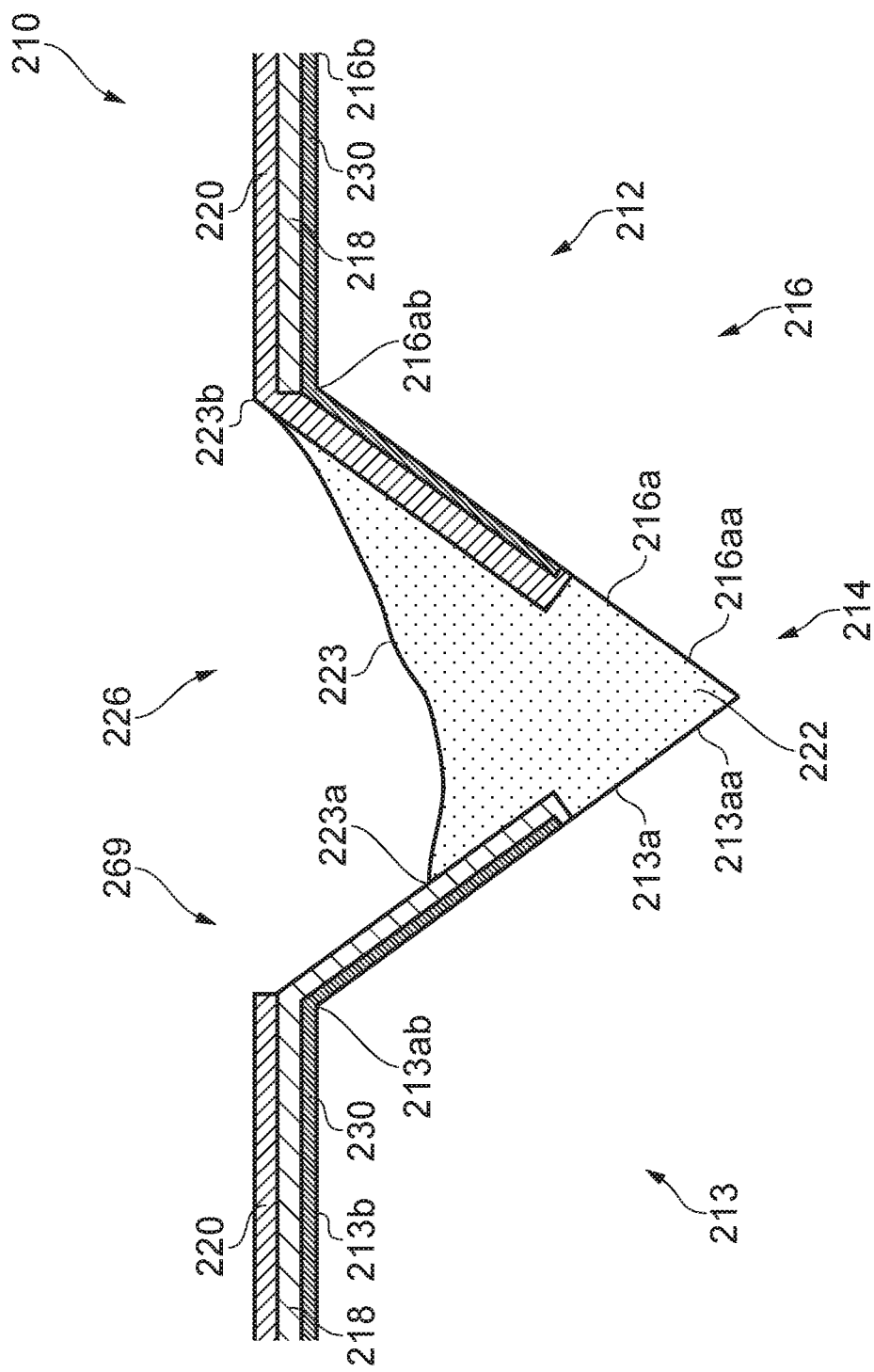
FIG. 2 is a cross-sectional view of a groove of an optoelectronic device according to a second embodiment of the present invention.

FIG. 2 shows a second embodiment of an optoelectronic device 210. Where the features are the same as the FIG. 1 embodiment, the reference numbers are the same except preceded by a "2". The optoelectronic device 210 comprises a substrate 212 comprising a groove 214. The groove 214 comprises a first 213a and second 216a face defining a cavity 226 of the groove 214 therebetween. The groove 214 further comprises a conductor material 218, a semiconductor material 220, and another semiconductor material 222.

The first 213a and second 216a faces of the groove 214 each have a first 213aa, 216aa and a second 213ab, 216ab end. The first ends 213aa, 216aa are in contact at the centre of the groove 214. The second ends 213ab, 216ab are detached at a top of the cavity 226. The groove 214 is v-shaped.

The first and second sides 213, 216 of the groove 214 are each coated with an adhesive material 230. The adhesive material 230 is a layer of adhesive material. A layer of semiconductor material 220 is on top of a layer of conductor material 218; and the layer of conductor material 218 is underneath the layer of semiconductor material 220. The layer of adhesive material 230 is underneath the layer of conductor material 218.

The layer of adhesive material 230 is in contact with the first face 213a, first surface 213b, second face 216a and second surface 216b of the groove 114, the conductor material 218 and the semiconductor material 220. The conductor material 218 coats the first face 213a of the groove 214 and first surface 213b of the substrate 212 adjacent the groove 214. The conductor material 218 also coats the second surface 216b of the substrate 212 adjacent the groove 214. The semiconductor material 220 coats the second face 216a of the groove 214 and second surface 216b of the substrate 212 adjacent the groove 214. The semiconductor material 220 also coats the first surface 213b of the substrate 212 adjacent the groove 214.

The another semiconductor 222 partially fills the groove 214 between the first 213a and second 216a faces of the groove 214. The depth 223b of the another semiconductor material 222 in the groove 214 at the second face 216a is greater than the depth 223a of the another semiconductor material 222 at the first face 213a. A surface 223 of the another semiconductor 222 is at an angle, or tilted, with respect to the plane of the substrate 212.

A gap 269 between the semiconductor material 220 and the another semiconductor material 222 at the first side 213 of the groove 214 means that the another semiconductor material 222 is not in contact with the semiconductor material 220 on the first side 213 of the groove 214.

Figure 3:
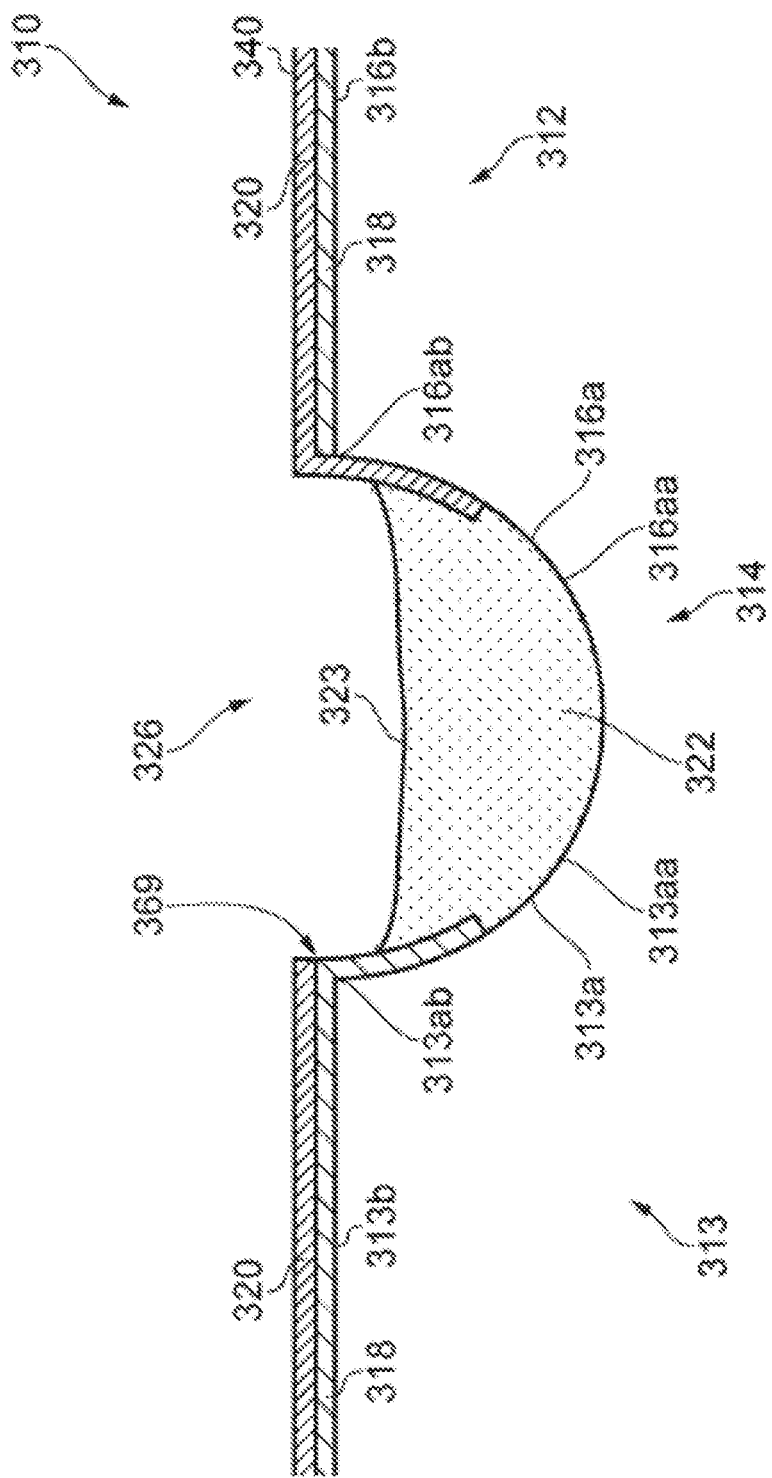
FIG. 3 is a cross-sectional view of a groove of an optoelectronic device according to a third embodiment of the present invention.

FIG. 3 shows a third embodiment of an optoelectronic device 310. Where the features are the same as previous embodiments, the reference numbers are the same except preceded by a "3". The optoelectronic device 310 comprises a substrate 312 comprising a groove 314. The groove 314 comprises a first 313a and second 316a face defining a cavity 326 of the groove 314 therebetween. The groove 314 further comprises a conductor material 318, a semiconductor material 320, and another semiconductor material 322.

The first 313a and second 316a faces of the groove 314 each have a first 313aa, 316aa and a second 313ab, 316ab end. The first ends 313aa, 316aa are in contact at the centre of the groove 314. The second ends 313ab, 316ab are detached at a top of the cavity 326. The groove 314 is rounded, that is semi-circular in shape.

A layer of semiconductor material 320 is on top of a layer of conductor material 318; and the layer of conductor material 318 is underneath the layer of semiconductor material 320. The conductor material 318 is in contact with the first face 313a of the groove 314 and first surface 313b of the substrate 312 adjacent the groove 314. The conductor material 318 is also in contact with the second surface 316b of the substrate 312 adjacent the groove 314. The semiconductor material 320 is in contact with the second face 316a of the groove 314 and coats the second surface 316b of the substrate 312 adjacent the groove 314. The semiconductor material 320 also coats the first surface 313b of the substrate 312 adjacent the groove 314.

The another semiconductor 322 partially fills the groove 314 between the first 313a and second 316a faces of the groove 314. A surface 323 of the another semiconductor 322 is meniscus shaped, or concave shaped, such that portions of the surface 323 adjacent the first 313a and second 313b faces are tilted at an angle with respect to the plane of the substrate 312.

A gap 369 between the semiconductor material 320 and the another semiconductor material 322 at the first side 313 of the groove 314 means that the another semiconductor material 322 is not in contact with the semiconductor material 320 on the first side 313 of the groove 314.

Figure 4:
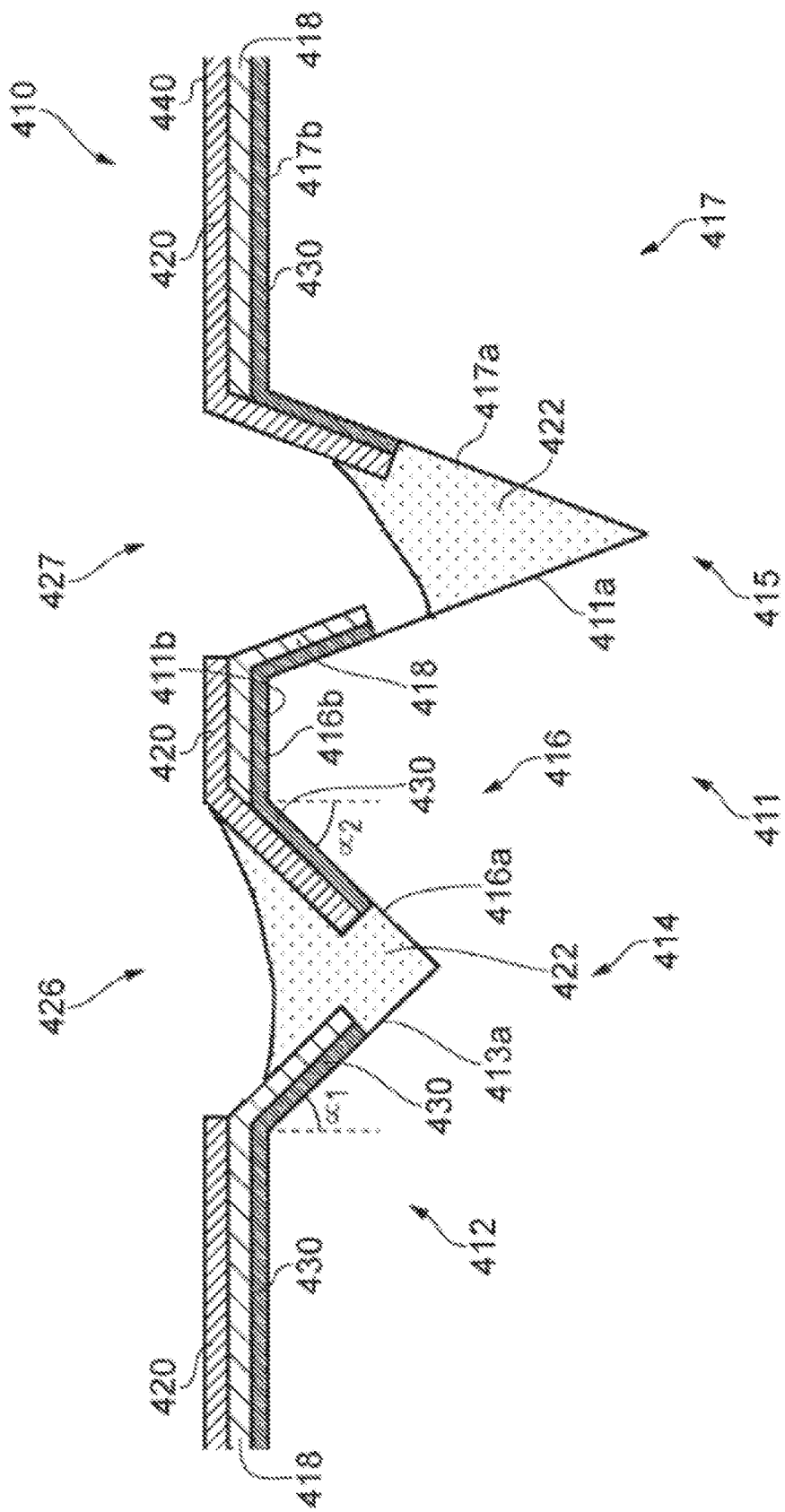
FIG. 4 is a cross-sectional view of a groove and a channel of an optoelectronic device according to a fourth embodiment of the present invention.

FIG. 4 shows a fourth embodiment of an optoelectronic device 410. Where the features are the same as previous embodiments, the reference numbers are the same except preceded by a "4". The optoelectronic device 410 comprises a substrate 412 and groove 414 the same as that shown in FIG. 2. The optoelectronic device 410 further comprises a channel 415. The channel 415 is a delineation feature.

The channel 415 has a first 411 and a second 417 side. The first side 411 of the channel 415 comprises a first face 411a of the channel 415 and a first surface 411b of the substrate 412 adjacent the channel 415. The second side 417 of the channel 415 comprises a second face 417a of the channel 415 and a second surface 417b of the substrate 412 adjacent the channel 415. The first 411b and second 417b surfaces adjacent the channel 415 are substantially parallel with the substrate 412. The first 411 and second 417 sides of the channel 415 are coated with the conductor material 418 and the semiconductor material 420.

The second side 416 of the groove 414 comprises a second surface 416b of the substrate 412 adjacent the groove 414. The second surface 416b of the substrate 412 adjacent the groove 414 is the same as the first surface 411b of the substrate 412 adjacent the channel 415.

There is a channel cavity 427 between the first 411a and second 417a faces of the channel 415. The channel cavity 427 between the first 411 and second 417 faces of the channel 415 is v-shaped, the same shape as the cavity 426 between the first 413a and second 416a faces of the groove 414.

The first face 413a of the groove 414 is at a 45° angle ($\alpha_1$) relative to a plane of the substrate 412 and the second face 416a of the groove 414 is at a 45° angle ($\alpha_2$) relative to a plane of the substrate 412.

A layer of adhesive material 430 is in contact with the first face 411a, first surface 411b, second face 417a and second surface 417b of the channel 415, the conductor material 418 and the semiconductor material 420. The conductor material 418 coats the first face 411a of the channel 415 and first surface 411b of the substrate 212 adjacent the channel 415. The conductor material 418 also coats the second surface 417b of the substrate 412 adjacent the channel 415. The semiconductor material 420 coats the second face 417a of the channel 415 and second surface 417b of the substrate 412 adjacent the channel 415. The semiconductor material 420 also coats the first surface 411a of the substrate 412 adjacent the channel 415.

There is no electrical communication between the conductor material 418 on the first side 411a of the channel 415, semiconductor material 420 on the second side 417a of the channel 415, and the another semiconductor material 422 in the channel 415. The channel 415 is non-conductive. The channel 415 insulates the first 411 and second 417 sides of the channel 415 from one another.

The depth of the channel 415 is twice the depth of the groove 414, as measured from an upper surface 440 of the substrate 412 to a point in the channel 415 or groove 414 furthest from the upper surface 440.

Figure 5:
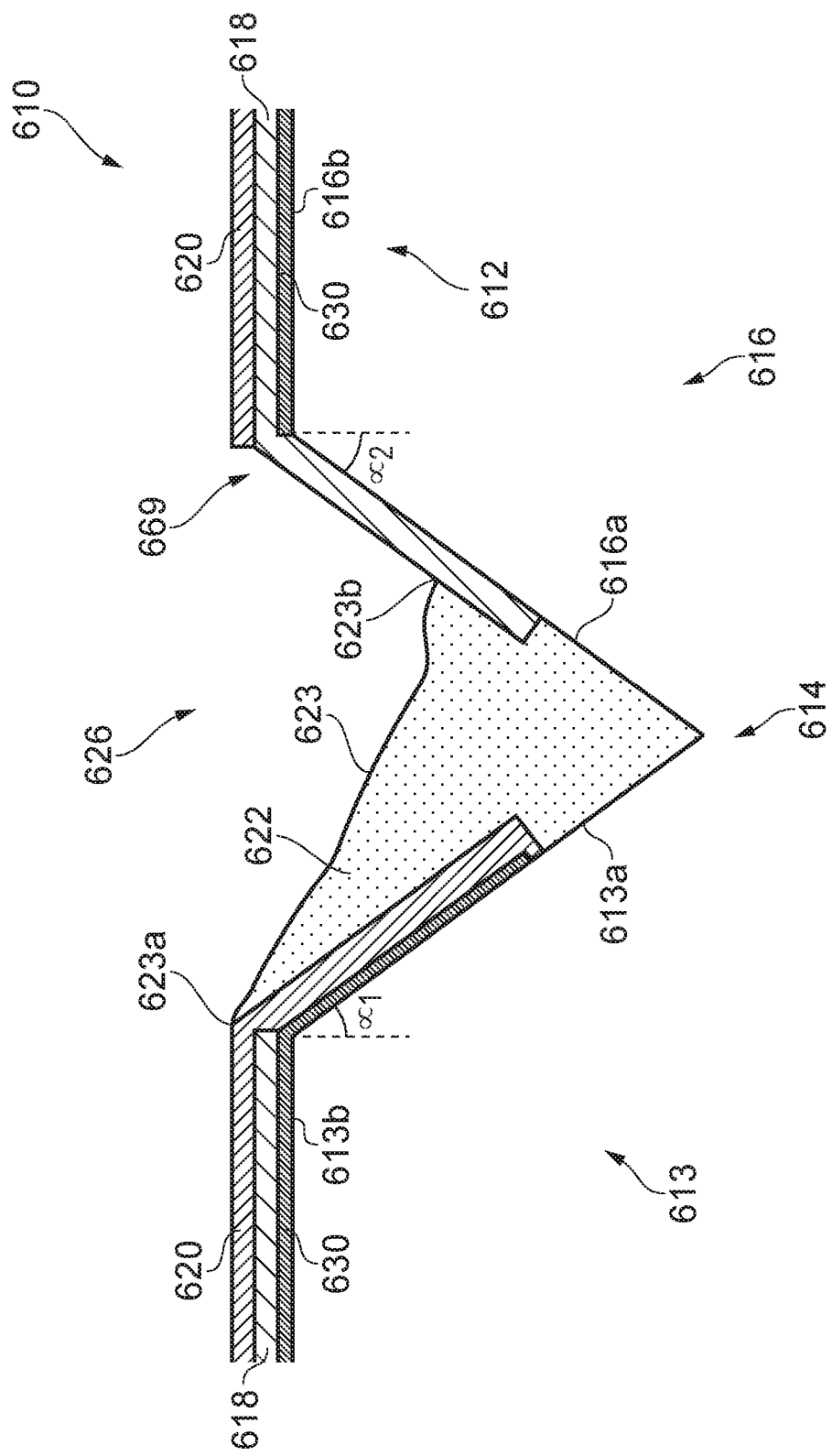
FIG. 5 is a cross-sectional view of a groove of an optoelectronic device according to a fifth embodiment of the present invention.
Figure 6:
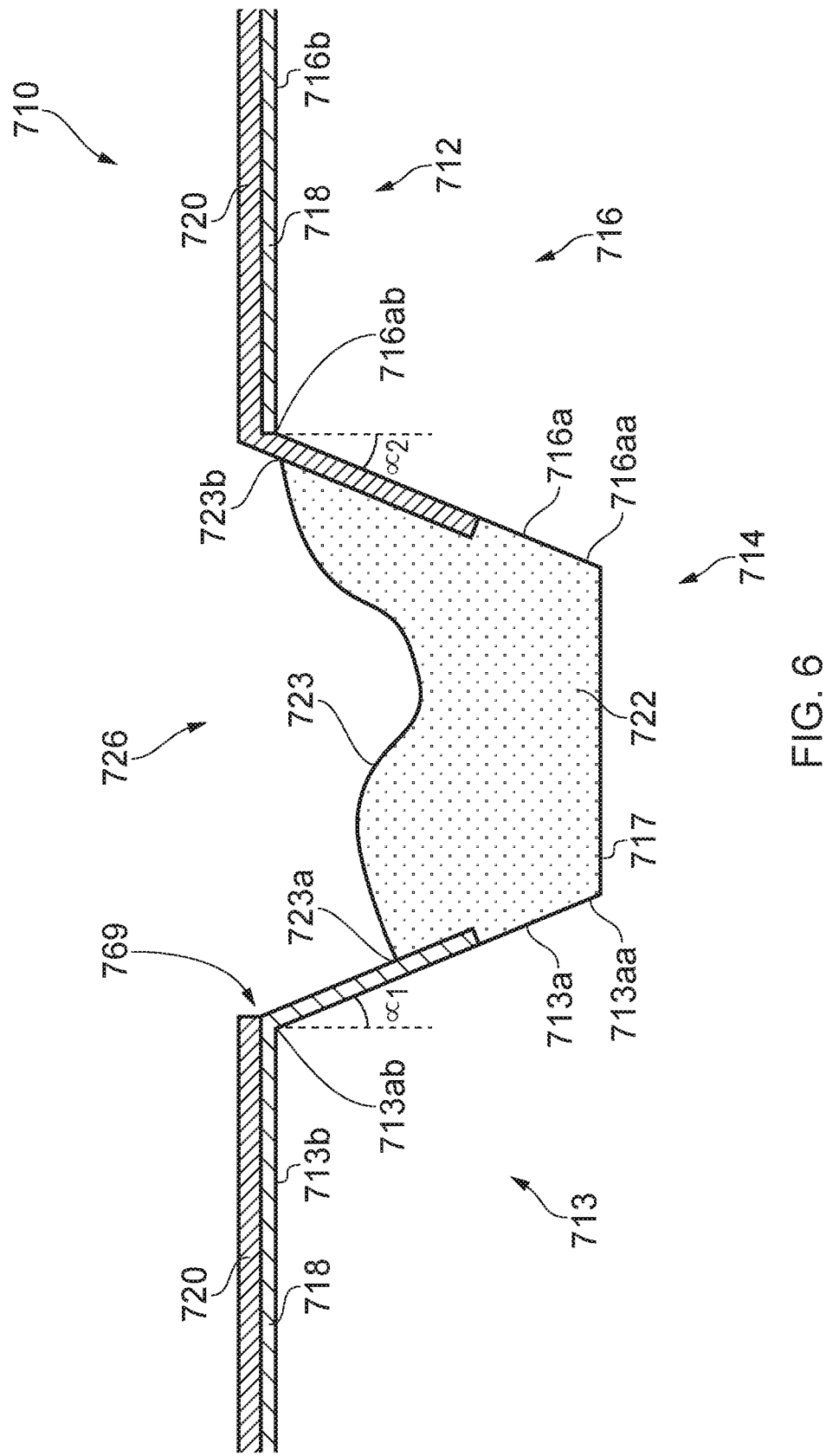
FIG. 6 is a cross-sectional view of a groove of an optoelectronic device according to a sixth embodiment of the present invention.

FIG. 5 shows a fifth embodiment of an optoelectronic device 610. Where the features are the same as previous embodiments, the reference numbers are the same except preceded by a "6". The embodiment shown in FIG. 6 is similar to the embodiment shown in FIG. 2, such that the optoelectronic device 610 comprises a substrate 612 comprising a v-shaped groove 614. The groove 614 comprises a first 613a and second 616a face defining a cavity 626 of the groove 614 therebetween. The groove 614 further comprises a conductor material 618, a semiconductor material 620, and another semiconductor material 622.

The first and second sides 613, 616 of the groove 614 are each coated with a layer of adhesive material 630. The layer of adhesive material 630 is in contact with the first face 613a, first surface 613b, and second surface 616b of the groove 614, the conductor material 618 and the semiconductor material 620.

The conductor material 618 coats the first surface 613b of the substrate 612 adjacent the groove 614. The conductor material 618 also coats the second face 616a of the groove 614 and is in contact with the second surface 616b of the substrate 612 adjacent the groove 614. The semiconductor material 620 coats the first face 613a of the groove 614 and first surface 613b of the substrate 612 adjacent the groove 614. The semiconductor material 620 also coats the second surface 616b of the substrate 612 adjacent the groove 614.

The another semiconductor 622 partially fills the groove 614 between the first 613a and second 616a faces of the groove 614. The depth 623a of the another semiconductor material 622 in the groove 614 at the first face 613a is greater than the depth 623b of the another semiconductor material 622 at the second face 616a. A surface 623 of the another semiconductor 622 is tilted with respect to the plane of the substrate 612.

A gap 669 between the semiconductor material 620 and the another semiconductor material 622 at the second side 616 of the groove 614 means that the another semiconductor material 622 is not in contact with the semiconductor material 620 on the second side 616 of the groove 614.

FIG. 6 shows a sixth embodiment of an optoelectronic device 710. Where the features are the same as previous embodiments, the reference numbers are the same except preceded by a "7". The embodiment shown in FIG. 6 is similar to the embodiment shown in FIG. 1, such that the optoelectronic device 710 comprises a substrate 712 comprising a groove 714 having a first 713 and a second 716 side.

The first side 713 of the groove 714 comprises a first face 713a of the groove 714 and a first surface 713b of the substrate 712 adjacent the groove 714. The second side 716 of the groove 714 comprises a second face 716a of the groove 714 and a second surface 716b of the substrate 712 adjacent the groove 714. The first 713a and the second 716a face of the groove 714 define a cavity 726 of the groove 714 therebetween.

The first face 713a of the groove 714 is at a 60° angle ($\alpha_1$) relative to a plane of the substrate 712. The second face 716a of the groove 714 is also at a 60° angle ($\alpha_2$) relative to the plane of the substrate 712.

The first 713a and second 716a faces of the groove 714 each have a first 713aa, 716aa and a second 713ab, 716ab end. The first ends 713aa, 716aa separately contact a flat bottom 717 of the groove 714; and the second ends 713a, 716ab are detached at a top of the cavity 726. The groove 714 is considered to be substantially square shaped.

The first 713 and second 716 sides of the groove 714 are each coated with a layer of conductor material 718 and a layer of semiconductor material 720. The conductor material 718 is in contact with the first face 713a of the groove 714 and first surface 713b of the substrate 712 adjacent the groove 714. The conductor material 718 is also in contact with the second surface 716b of the substrate 712 adjacent the groove 714. The semiconductor material 720 is in contact with the second face 716a of the groove 714 and coated on the second surface 716b of the substrate 712 adjacent the groove 714. The semiconductor material 720 is also coated on the first surface 716b of the substrate 712 adjacent the groove 714.

The another semiconductor 722 partially fills the groove 714 between the first 713a and second 716a faces of the groove 714. The another semiconductor 722 in the groove 714 has an undulating surface 723 between the first 713a and second 716a faces of the groove 714. The depth 723a of the another semiconductor material 722 in the groove 714 at the first face 713a is less than the depth 723b of the another semiconductor material 722 at the second face 716a. The surface 723 of the another semiconductor 722 is at an angle with respect to the plane of the substrate 712.

The another semiconductor material 722 contacts the first face 713a of the groove 714 and the conductor material 718 at the first side 713 of the groove 714. The another semiconductor material 722 contacts the second face 716a of the groove 714 and the semiconductor material 720 at the second side 716 of the groove 714.

A gap 769 between the semiconductor material 720 and the another semiconductor material 722 at the first side 713 of the groove 714 means that the another semiconductor material 722 is not in contact with the semiconductor material 720 on the first side 713 of the groove 714.

Figure 7:
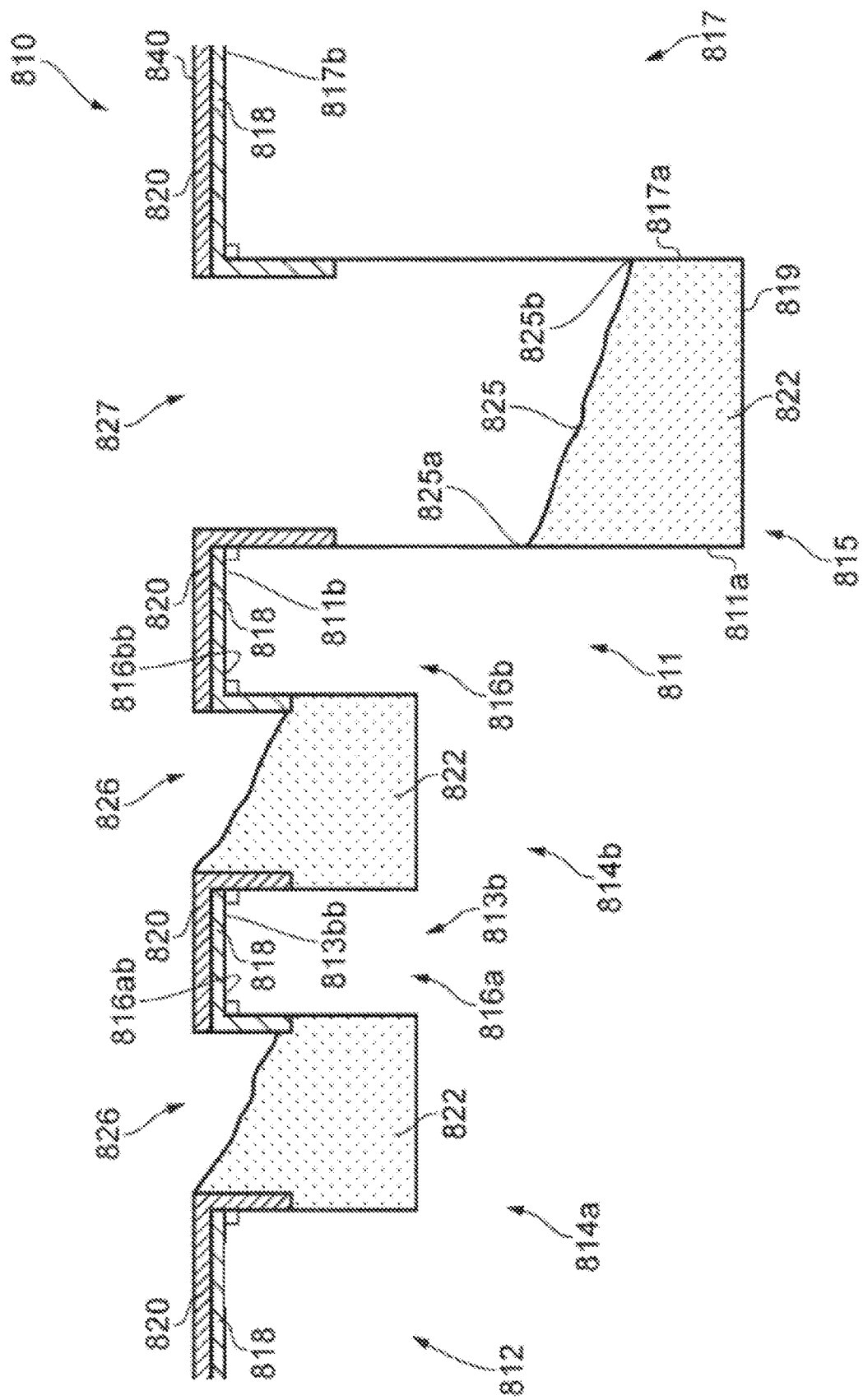
FIG. 7 is a cross-sectional view of two grooves and a channel of an optoelectronic device according to a seventh embodiment of the present invention.

FIG. 7 shows a seventh embodiment of an optoelectronic device 810. Where the features are the same as previous embodiments, the reference numbers are the same except preceded by an "8". The optoelectronic device 810 comprises a substrate 812 and groove as shown in FIG. 1. The optoelectronic device 810 comprises two identical grooves 814a, 814b and a channel 815. The channel 815 is a delineation feature.

The channel 815 has a first 811 and a second 817 side. The first side 811 of the channel 815 comprises a first face 811a of the channel 815 and a first surface 811b of the substrate 812 adjacent the channel 815. The second side 817 of the channel 815 comprises a second face 817a of the channel 815 and a second surface 817b of the substrate 812 adjacent the channel 815.

A second side 816a of the groove 814a comprises a second surface 816ab of the substrate 812 adjacent the groove 814a. A first side 813b of the groove 814b comprises a first surface 813bb of the substrate 812 adjacent the groove 814b. The second surface 816ab of the substrate 812 adjacent the groove 814a is the same as the first surface 813bb of the substrate 812 adjacent the groove 814b.

A second side 816b of the groove 814b comprises a second surface 816bb of the substrate 812 adjacent the groove 814b. The second surface 816bb of the substrate 812 adjacent the groove 814b is the same as the first surface 811b of the substrate 812 adjacent the channel 815.

The first face 811a of the channel 815 and the second face 817a of the channel 815 are both perpendicular to the plane of the substrate 812, that is they are at a 90° angle relative to a normal from the substrate 812. The channel 815 is square shaped, such that the first 811a and second 817a faces of the channel 815 separately contact a base 819 of the channel 815.

There is a channel cavity 827 between the first 811a and second 817a faces of the channel 815. The first face 811a of the channel 815 is at a 90° angle relative to a normal from the substrate 812 and the second face 817a of the channel 815 is at a 90° angle relative to a normal from the substrate 812. The channel cavity 827 between the first 811 and second 817 faces of the channel 815 is square shaped, the same as the shape as the cavity 826 of both grooves.

A conductor material 818 is in contact with the second face 817a of the channel 815 and second surface 817b of the substrate 812 adjacent the channel 815. The conductor material 818 is also in contact with the first surface 811b of the substrate 812 adjacent the channel 815. A semiconductor material 820 is in contact with the first face 811a of the channel 815 and coated on the first surface 811b of the substrate 812 adjacent the channel 815. The semiconductor material 820 is also coated on the second surface 817b of the substrate 812 adjacent the channel 815.

The depth 825b of the another semiconductor material 822 in the channel 815 at the second face 817a is less than the depth 825a of the another semiconductor material 822 at the first face 811a. The surface 825 of the another semiconductor 822 is at an angle, or tilted, with respect to the plane of the substrate 812.

There is no electrical communication between the conductor material 818 on the second side 817a of the channel 815, semiconductor material 820 on the first side 811a of the channel 815, and the another semiconductor material 822 in the channel 815. The channel 815 therefore insulates the first 811 and second 817 sides of the channel 815 from one another.

The depth of the channel 815 is more than twice the depth of the grooves 814a, 814b as measured from an upper surface 840 of the substrate 812 to a point in the channel 815 or groove 814a, 814b furthest from the upper surface 840.

Figure 8:
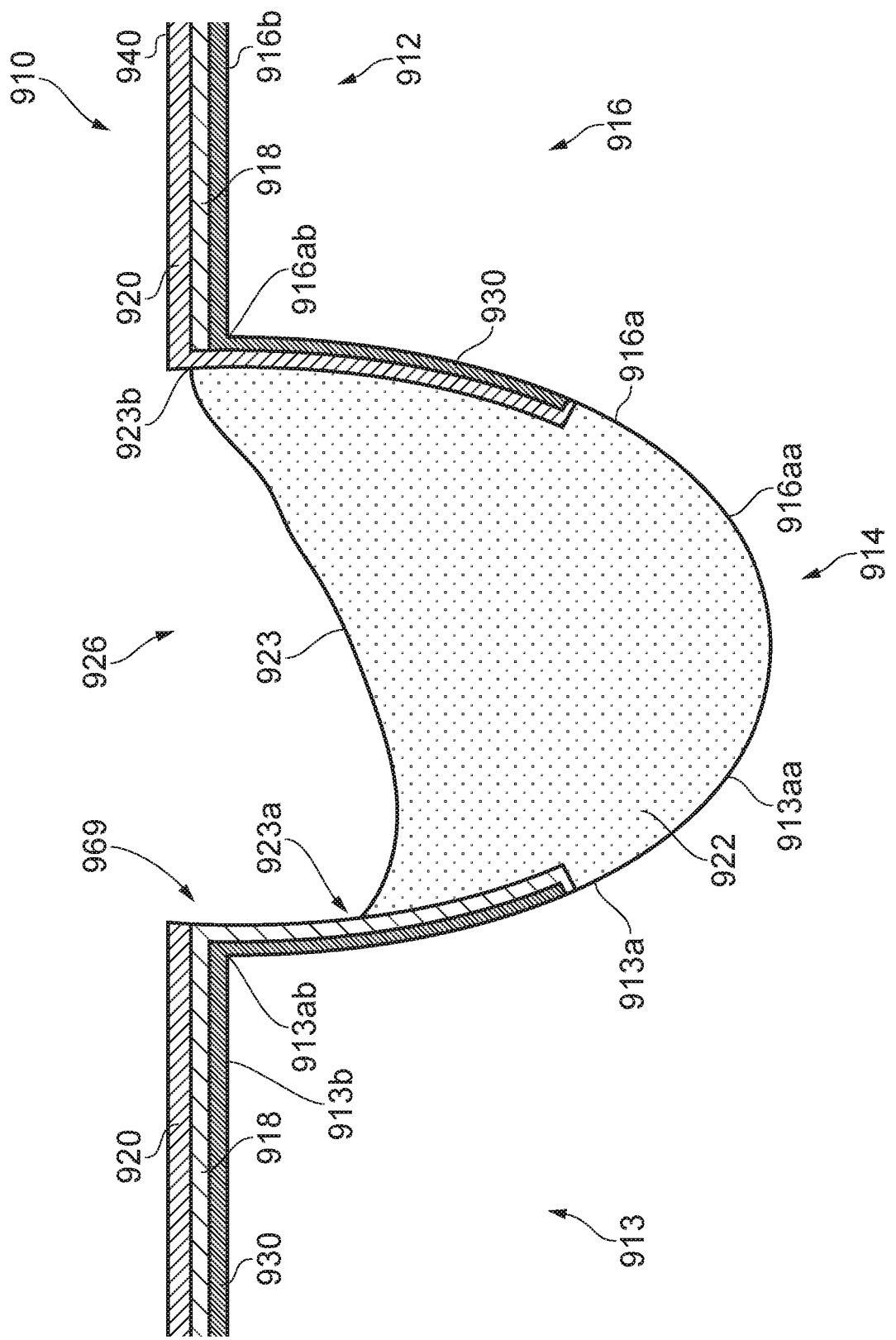
FIG. 8 is a cross-sectional view of a groove of an optoelectronic device according to an eighth embodiment of the present invention.

FIG. 8 shows an eighth embodiment of an optoelectronic device 910. Where the features are the same as previous embodiments, the reference numbers are the same except preceded by a "9". The embodiment shown in FIG. 8 is similar to the embodiment shown in FIG. 3. The optoelectronic device 910 comprises a substrate 912 comprising a groove 914. The groove 914 comprises a first 913a and second 916a face defining a cavity 926 of the groove 914 therebetween. The groove 914 further comprises a conductor material 918, a semiconductor material 920, and another semiconductor material 922.

The first 913a and second 916a faces of the groove 914 each have a first 913aa, 916aa and a second 913ab, 916ab end. The first ends 913aa, 916aa are in contact at the centre of the groove 914. The second ends 913ab, 916ab are detached at a top of the cavity 926. The groove 914 is rounded. The depth of the groove 914 is more than twice the depth of the groove 314 shown in FIG. 3, as measured from an upper surface 340, 940 of the substrate 312, 912 to a point in the groove 314, 914 furthest from the upper surface 340, 940.

The first and second sides 913, 916 of the groove 914 are each coated with a layer of adhesive material 930. A layer of semiconductor material 920 is on top of a layer of conductor material 918; and the layer of conductor material 918 is underneath the layer of semiconductor material 920. The layer of adhesive material 930 is underneath the layer of conductor material 918.

The layer of adhesive material 930 is in contact with the first face 913a, first surface 913b, second face 916a and second surface 916b of the groove 914, the conductor material 918 and the semiconductor material 920. The conductor material 918 coats the first face 913a of the groove 914 and first surface 913b of the substrate 912 adjacent the groove 914. The conductor material 918 also coats the second surface 916b of the substrate 912 adjacent the groove 914. The semiconductor material 920 coats the second face 916a of the groove 914 and second surface 916b of the substrate 912 adjacent the groove 914. The semiconductor material 920 also coats the first surface 913b of the substrate 912 adjacent the groove 914.

The another semiconductor 922 partially fills the groove 914 between the first 913a and second 916a faces of the groove 914. The depth 923b of the another semiconductor material 922 in the groove 914 at the second face 916a is greater than the depth 923a of the another semiconductor material 922 at the first face 913a. A surface 923 of the another semiconductor 922 is at an angle, or tilted, with respect to the plane of the substrate 912.

A gap 969 between the semiconductor material 920 and the another semiconductor material 922 at the first side 913 of the groove 914 means that the another semiconductor material 922 is not in contact with the semiconductor material 920 on the first side 913 of the groove 914.

Figure 9:
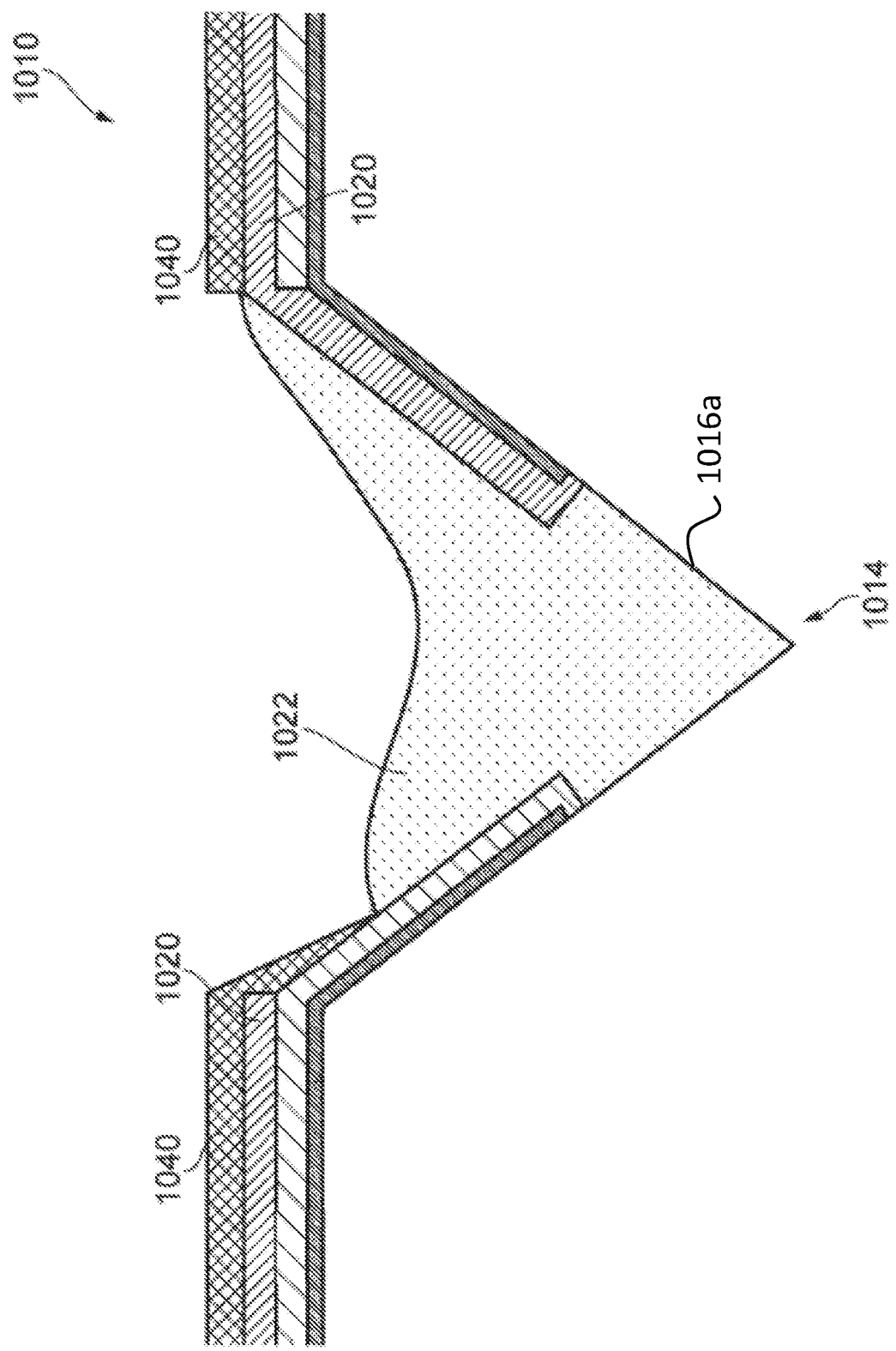
FIG. 9 is a cross-sectional view of a groove of an optoelectronic device according to a ninth embodiment of the present invention.

FIG. 9 shows an ninth embodiment of an optoelectronic device 1010. Where the features are the same as previous embodiments, the reference numbers are the same except preceded by a "10". The embodiment shown in FIG. 9 is similar to the embodiment shown in FIG. 2.

The semiconductor material 1020 on the first surface of the substrate adjacent the groove 1014 and therefore on the first side of the groove is coated with an insulator material 1040. The insulator material 1040 is on top of the semiconductor material 1020 on the first surface of the substrate.

The first face of the groove 1016a and a first surface of the substrate adjacent the groove 1014 make up the first side of the groove.

The insulator material is an electrical insulator material comprising polytetrafluoroethylene (PTFE) or polypropylene. The insulator material electrically insulates the semiconductor material 1020 on the first surface of the substrate adjacent the groove from the another semiconductor 1022 in the groove 1014.

During manufacture of the optoelectronic device, the insulator material 1040 repelles the another semiconductor material 1022 when the another semiconductor material is being deposited in the groove 1014. This increases the size of the gap between the semiconductor material on the first side of the groove and the another semiconductor material 1022 in the groove 1014.

Modifications and improvements can be incorporated herein without departing from the scope of the invention.

The invention claimed is:

1. An optoelectronic device comprising:
a substrate comprising a groove having a first side and a second side;
wherein the first side of the groove and the second side of the groove are each partially coated with both a conductor material and a first semiconductor material;
wherein a second semiconductor material is in the groove such that the first semiconductor material on the first side of the groove and the conductor material on the second side of the groove are both in contact with the second semiconductor material in the groove; and
wherein there is a gap between the first semiconductor material on the second side of the groove and the second semiconductor material in the groove.

2. The optoelectronic device according to claim 1, wherein the gap is an air gap.

3. The optoelectronic device according to claim 1, wherein the gap between the first semiconductor material and the second semiconductor material at the second side of the groove has a length of at least 10 nm.

4. The optoelectronic device according to claim 1, wherein the gap between the first semiconductor material and the second semiconductor material mitigates a charge transfer path from the first semiconductor material on the first side of the groove, through the second semiconductor material, and into the first semiconductor material on the second side of the groove.

5. The optoelectronic device according to claim 1, wherein the first side of the groove comprises a first face of the groove and a first surface of the substrate adjacent the groove, the second side of the groove comprises a second face of the groove and a second surface of the substrate adjacent the groove, and the first surface adjacent the groove and the second surface adjacent the groove are at least substantially in the same plane as the substrate.

6. The optoelectronic device according to claim 1, wherein the second semiconductor material at least partially fills the groove between the first side of the groove and the second side of the groove.

7. The optoelectronic device according to claim 1, wherein the second semiconductor material has a surface that is inclined or declined relative to a normal from the substrate.

8. The optoelectronic device according to claim 1, wherein the groove is v-shaped, rounded or square.

9. The optoelectronic device according to claim 1, wherein the groove has a volume and the second semiconductor material occupies from 20 to 50% of the volume of the groove.

10. The optoelectronic device according to claim 1, wherein the first semiconductor material covers from 40 to 60% of the first side of the groove.

11. The optoelectronic device according to claim 1, wherein the conductor material covers from 40 to 60% of the second side of the groove.

12. The optoelectronic device according to claim 1, wherein the first semiconductor material is an n-type semiconductor material and the second semiconductor material is a p-type semiconductor material.

13. The optoelectronic device according to claim 1, wherein the first semiconductor material and the second another semiconductor material are different materials so as to provide ohmic and rectifying contacts.

14. The optoelectronic device according to claim 1, wherein the substrate comprises a first series of grooves, a second series of grooves and a channel between the first series of grooves and the second series of grooves, the groove of claim 1 being any one of the grooves of the first series of grooves or the second series of grooves.

15. The optoelectronic device according to claim 14, wherein the first series of grooves comprises a plurality of grooves, the second series of grooves comprises a plurality of grooves, wherein each of the plurality of grooves within the first series of grooves and the second series of grooves extends from a first end to a second end, and wherein the channel transects each of the plurality of grooves of the first series of grooves towards the first end of each of the plurality of grooves, passes between the first series of grooves and the second series of grooves, and transects each of the plurality of grooves of the second series of grooves towards the second end of each of the plurality of grooves.

16. The optoelectronic device according to claim 14, wherein the channel has a depth, each of the plurality of grooves of the first series of grooves has a depth, each of the plurality of grooves of the second series of grooves has a depth, wherein the depth of each of the plurality of grooves within the first series of grooves is substantially the same as the depth of each of the plurality of grooves within the second series of grooves, and the depth of the channel is at least twice the depth of each of the plurality of grooves of the first series of grooves.

17. The optoelectronic device according to claim 5, wherein the first semiconductor material on the first surface of the substrate adjacent the groove is further coated with an insulator material.

18. The optoelectronic device according to claim 1, wherein the optoelectronic device is a solar photovoltaic cell.

* * * * *